United States Patent [19]
Sekiwa

[11] 4,200,018
[45] Apr. 29, 1980

[54] CIRCUIT BOARD WIRE TRIMMING APPARATUS

[75] Inventor: Mitsunao Sekiwa, Hirakata, Japan

[73] Assignee: Matsushita Electric Industrial Co., Ltd., Kodama, Japan

[21] Appl. No.: 855,901

[22] Filed: Nov. 29, 1977

[30] Foreign Application Priority Data

Nov. 29, 1976 [JP] Japan .................. 51-143866
Nov. 29, 1976 [JP] Japan .................. 51-160387[U]
Aug. 24, 1977 [JP] Japan .................. 52-113861[U]
Aug. 24, 1977 [JP] Japan .................. 52-113862[U]

[51] Int. Cl.² .................. B23D 33/02; B26D 7/06
[52] U.S. Cl. .................. 83/425; 83/925 R; 83/435; 83/436; 83/437
[58] Field of Search .................. 83/436, 437, 435, 425, 83/925, 404, 420; 29/566.3

[56] References Cited

U.S. PATENT DOCUMENTS 3,972,262  8/1976  Albert ........................ 83/404
4,072,077  2/1978  Morgan ........................ 83/425

Primary Examiner—Donald R. Schran
Attorney, Agent, or Firm—Wenderoth, Lind & Ponack

[57] ABSTRACT

First and second elongated support members for supporting a circuit board and for transporting the circuit board in one direction parallel to the lengthwise direction of the support members are provided on a frame, and a blade member is rotatably supported on the frame for rotation about its own axis in a plane parallel to the plane of the circuit board. While the circuit board is being transported with opposed edges of the circuit board guided along the support member, the blade member trims excessive length from wires extending from the circuit board.

22 Claims, 27 Drawing Figures

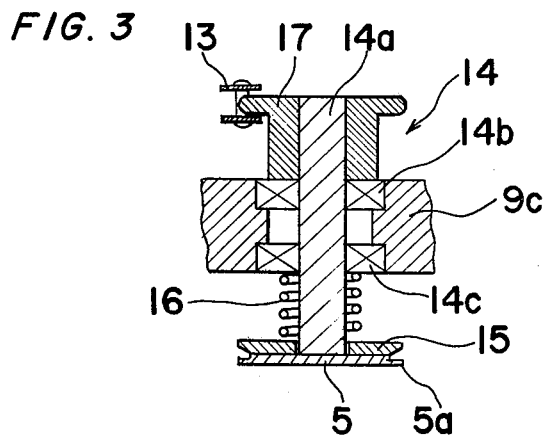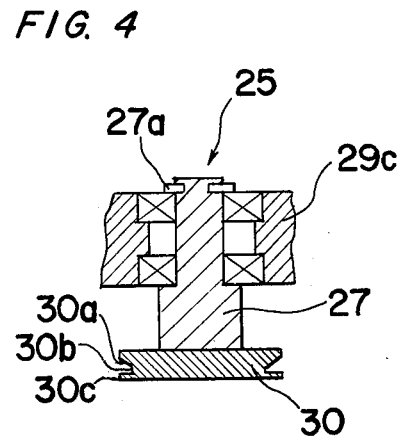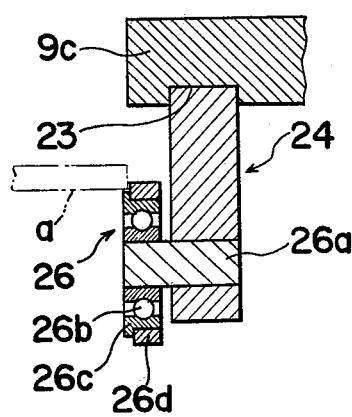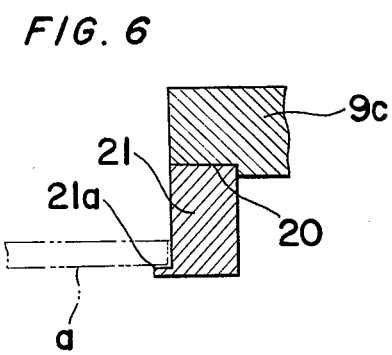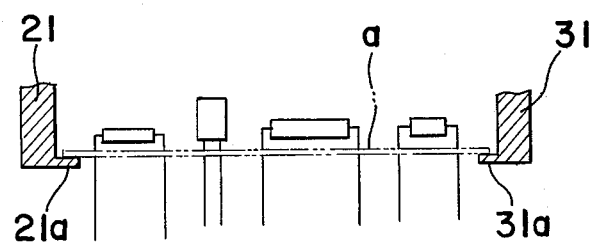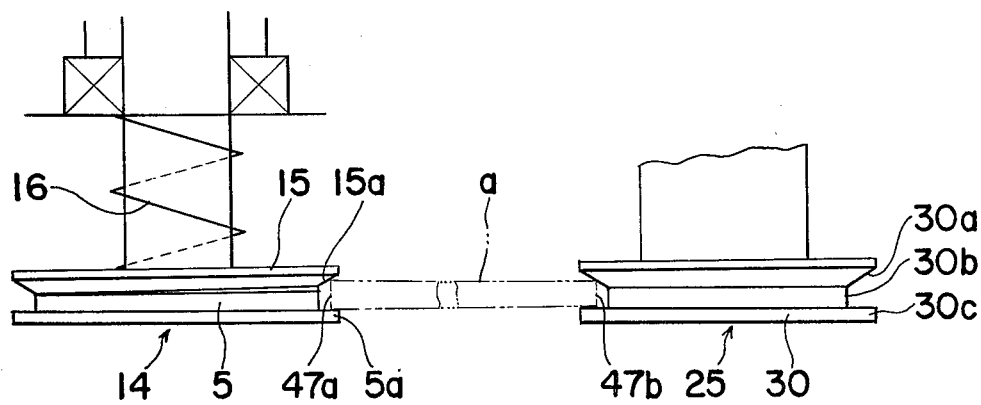

CIRCUIT BOARD WIRE TRIMMING APPARATUS

The present invention relates to a circuit board wire trimmer, and more particularly, to an apparatus for use in cutting excess length of lead lines of electronic and/or electric elements such as resistors, capacitors, diodes, relays, etc., which are mounted on a supporting board such as printed circuit board.

In preparing a circuit board, conductive lead lines, namely, legs, of the various electronic elements are insertd into corresponding holes formed in the circuit board of insulating material which is normally laminated with a conductive sheet, such as a copper sheet, in a predetermined pattern on one flat surface whereat the tip of each of the inserted legs is soldered to the conductive sheet. Since the legs of the elements are normally comparatively long, it is the conventional practice in the art to cut off excessive portions of the inserted legs of the element by the use of a cutting device, generally referred to as a circuit board wire trimmer, prior to or after the soldering operation.

According to one conventional circuit board wire wire trimmer which is disclosed in U.S. Pat. No. 3,453,918 of E. L. Sharp, the circuit board wire trimmer includes a frame on which the circuit board is placed, a driven cutting wheel held by an arm member movably connected to the frame for free movement thereof by the application of an external force such as by manual operation, in a plane parallel to and spaced from the plane of the circuit board.

However, according to this type of trimmer, the circuit board placed on the frame must be replaced by a manual operation or by an additional machine which operates independently with respect to the trimmer. Furthermore, it is necessary to keep an eye on the circuit board during the trimming operation thereof to ensure that all the legs are trimmed. Therefore, for the operation of the trimmer of the above described type, the operator must follow the steps of: placing the circuit board on the frame; manipulating the driven cutting wheel; and replacing the trimmed circuit board, such steps placing a limitation on the industrial output thereof. Furthermore, it is difficult to employ the trimmer of the above described type since there arises the disadvantage that such trimmer is not capable of being employed in an assembly line without the support of an additional machine.

In contrast to the above described type of circuit board trimmer, there has been proposed another type of trimmer which is disclosed in Japanese Utility Model Application Serial No. 25410/1975 of S. Yamamoto. This trimmer includes a pair of elongated guiding units each having a plurality of driven guiding rolls aligned along the longitudinal edge of the unit. The units are positioned in parallel relation to each other spaced a predetermined distance from each other for guiding and transmitting the circuit board therebetween, substantially between the opposite guiding rolls, one positioned in the first unit and the other positioned in the second unit. The trimmer further includes a disk blade member which is positioned below and closely adjacent a plane defined between the guiding units for trimming the legs of electronic and electric elements mounted on the circuit board, while the circuit board moves past the rotary blade member. In order to tightly hold the circuit board between the guiding units for preventing the circuit board from being pushed away from its position by the contact friction produced between the blade member and the legs, the distance between the guiding units is arranged to be slightly less than the width of the circuit board for substantially clamping the board therebetween.

However, according to the above described type of trimmer, the clamping force of the guiding units may often cause warping of the circuit board, so that the length of the remaining legs after being trimmed may be varied in such a manner that the remaining legs located close to the opposite edges of the board which are in contact with the guiding units are short, while the length of those towards the center between said opposite edges is longer, or on the contrary, that the legs located closed to the opposite edges of the board are long, while those at the center tend to be short.

For the purpose of tightly clamping the board between the guiding rolls, according to the trimmer of the Yamamoto, the guide rolls are formed with a V-shaped groove around the peripheral surface thereof for partly receiving the edge of the board into the groove, while the groove tightly holds the edge of the board. Although, such structure may minimize the warping or curvature in the board, there arises another disadvantage that the grooves may cause some damage such as scratches or cracks at the edge of the board, especially at the edge of the lower surface of the board.

Furthermore, in the case where the trimmer of the Yamamoto receives a circuit board already having a curvature formed by warping or the like in a forwarding direction thereof, the leading edge of the board, when the board is forwarded for some distance, may not be properly engaged by the driving rolls, thus misleading the board. Such misleading may not only result in damage to the circuit board, but also in damage to the blade member.

Accordingly, a primary object of the present invention is to provide a circuit board wire trimmer which is easy to operate with less manipulative steps required for the operator.

Another object of the present invention is to provide a circuit board wire trimmer of the above described type which can trim boards continuously one after another during the forwarding of the circuit board.

Still another object of the present invention is to provide a circuit board wire trimmer of the above described type which will not cause any damage to the board.

Still another object of the present invention is to provide a circuit board wire trimmer of the above described type which is capable of trimming various sizes of boards having different thicknesses, widths or lengths.

Still another object of the present invention is to provide a circuit board wire trimmer of the above described type which can properly forward a board having some curvature.

Still another object of the present invention is to provide a circuit board wire trimmer of the above described type in which the length of the remaining legs can be adjusted.

Still another object of the present invention is to provide a circuit board wire trimmer of the above described type which is capable of connecting a soldering device prior to or after the operation thereof.

Yet another object of the present invention is to provide a circuit board wire trimmer which can receive a circuit board having a variation in the width caused by a manufacturing step or the like.

In order to accomplish these and other objects and features, according to the present invention, there is provided a circuit board wire trimming apparatus for trimming undesired wire members protruding outwardly from a circuit board which comprises, in combination, a framework, and first and second elongated support means for supporting the circuit board and for transporting the board in a direction parallel to the lengthwise direction of the first and second elongated support means. The first elongated support means has a plurality of driving members in a row thereon in equally spaced relation to each other in a direction parallel to the direction of transportation of the circuit board, each of said driving members being constituted by a pair of coaxially aligned roll elements supported by the first elongated support means for rotation in a plane parallel to the plane of the circuit board being transported. The roll elements of each pair are placed one above the other and cooperate with each other to define a groove therebetween. The second elongated support means has a guide groove defined therein lengthwise of the second elongated support means for movable engagement of one of the opposite side edges of the circuit board therein.

The apparatus further comprises means for driving the driving members simultaneously to rotate the roll elements of all pairs and means provided for each of the roll elements for biasing either one of the roll elements of each pair towards the other of the roll elements of the pair to hold the other of the opposite side edges of the circuit board therebetween, thereby enabling the transmission of the rotational force of the roll elements of each pair to the circuit board to move the latter in one direction, with the opposite edges of the circuit board respectively movably engaged in the guide groove and the grooves of the pairs of the roll elements.

For trimming the undesired wire members, a blade member is rotatably supported on the framework for rotation about its own axis in a plane parallel to the plane of the circuit board, said blade member being positioned to trim the undesired wire members while said circuit board is transported with the opposed side edges respectively guided by the first and second elongated support means. The blade member is connected to means for driving the blade member.

These and other objects and features of the present invention will become apparent from the following description taken in conjunction with preferred embodiments thereof with reference to the accompanying drawings, in which:

FIGS. 3, 4, 5, 6 and 7 are cross sectional views taken along lines III—III, IV—IV, V—V, VI—VI and VII—VII, respectively, in FIG. 1;

FIG. 8 is a schematic side view showing the relation between a pair of rolls and a circuit board clamped therebetween;

Before the description of the present invention proceeds, it should be noted that like parts are designated by like reference numerals throughout the accompanying drawings.

Figure 1:
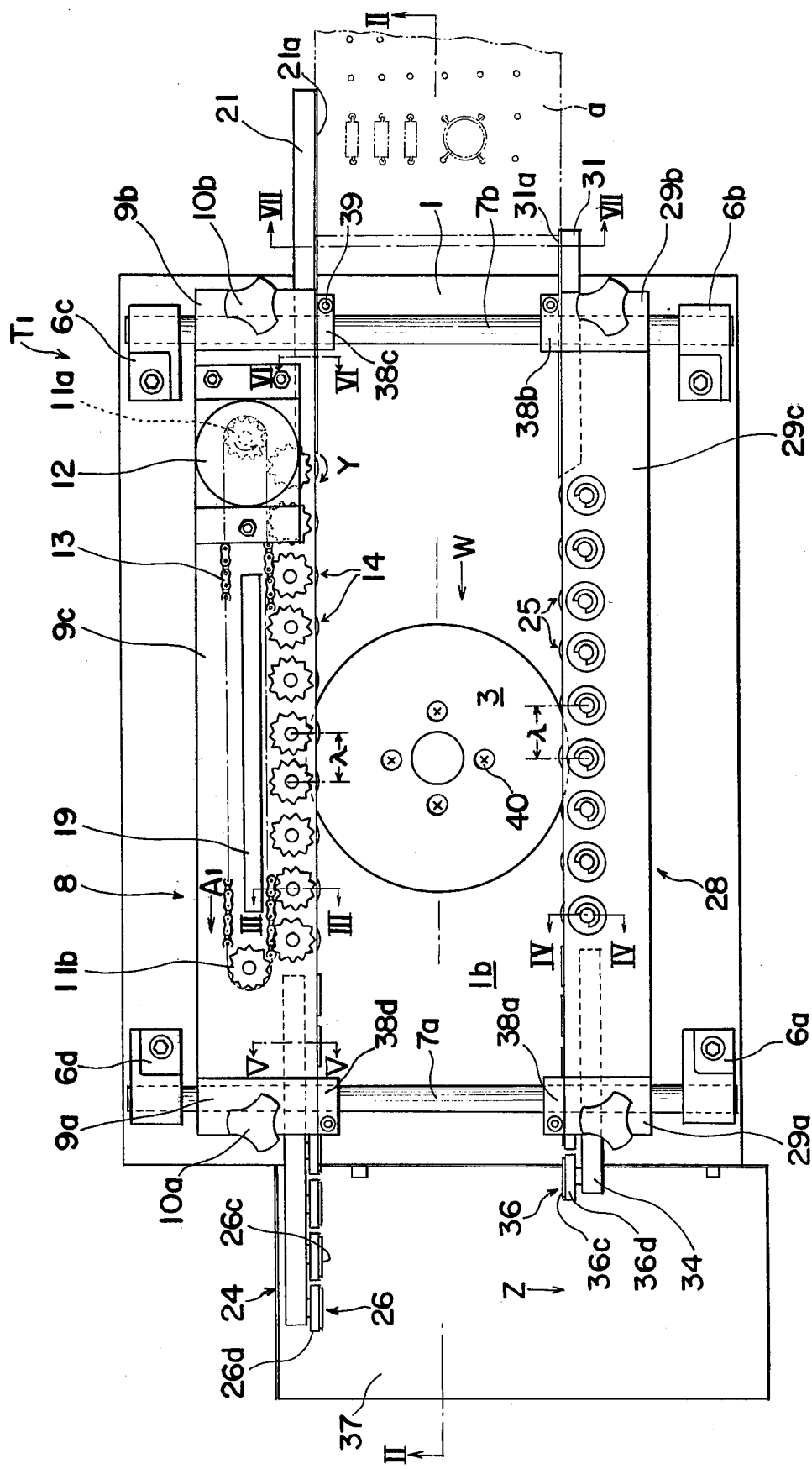
FIG. 1 is a top plan view of a circuit board wire trimming apparatus of the present invention.
Figure 2:
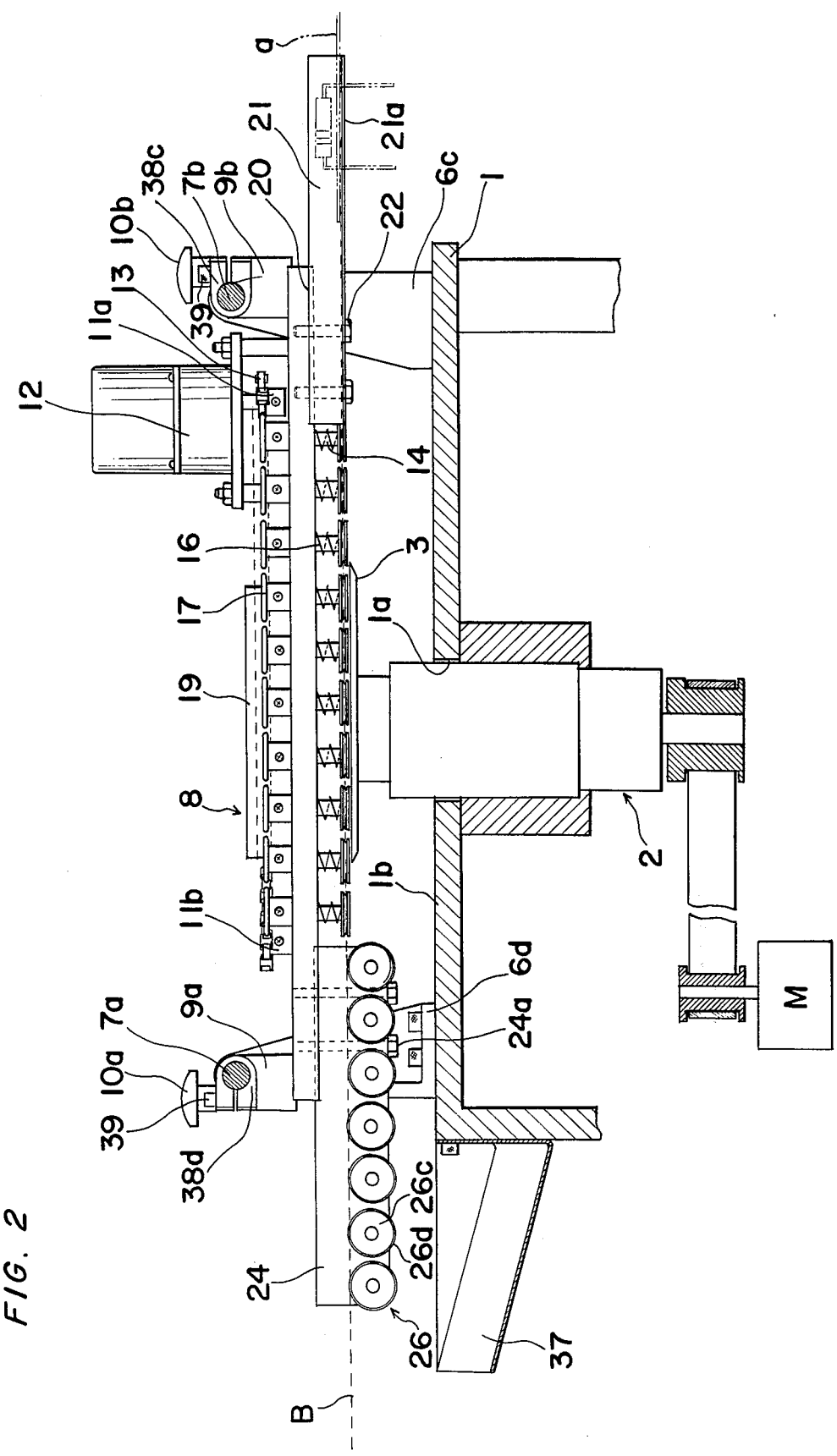
FIG. 2 is a cross sectional view taken along the line II—II in FIG. 1.

Referring to FIGS. 1 and 2, the circuit board wire trimmer $T_1$ of the present invention comprises a framework constructed of a rectangular base plate 1 made of solid metallic plate with a circular opening 1a formed at approximately the central portion thereof for accommodating therein a spindle unit 2 having a disk shaped blade member 3 at the upper end thereof, as viewed in FIG. 2. Four brackets 6a, 6b, 6c and 6d are secured on an upper face 1b of the base plate 1, said upper face corresponding with the face facing the blade member 3, at approximately the four corner portions thereof, respectively, and each of the brackets has an opening therein. Extended between the brackets 6a and 6d is a first supporting bar 7a, opposite end portions thereof being inserted into the opening of the respective brackets and being secured thereat by a suitable securing means. Likewise, a supporting bar 7b extends between the brackets 6b and 6c.

First and second supporting units 8 and 28 are mounted between the supporting bars 7a and 7b in a parallel relation and spaced from each other for defining a passage for a circuit board a to move along, the opposite edges of the first and second supporting units 8 and 28 facing each other, said passage being substantially parallel to the horizontal plane.

The first supporting unit 8 of substantially elongated shape for supporting and guiding one edge of the circuit board a comprises first and second clamping members 9a and 9b normally tightly clamped on the shafts 7a and 7b, respectively, by respective knobs 10a and 10b, and a rectangular platform 9c extending between the first and second clamping members 9a and 9b, the opposite ends of which are fastened to the respective clamping members.

The first supporting unit 8 further comprises a plurality of driving units 14 which are aligned along the lower edge, when viewed in FIG. 1, of the platform 9c at a predetermined pitch λ from each other and means for rotating each one of the driving units 14. The rotating means includes a pair of sprockets 11a and 11b which are spaced from each other a distance longer than the distance between the two driving units 14 positioned at opposite ends of the unit 8. An endless chain 13 is passed around the pair of sprockets 11a and 11b, and at least one of the sprockets, such as sprocket 11a is connected to a motor 12 for moving the endless chain 13 in the direction indicated by the arrow $A_1$. Each of the driving units 14, as best shown in FIG. 3, comprises a shaft 14a rotatably journalled in the platform 9c with one end extending from the upper surface of the platform 9c provided with a sprocket 17 engaging with the endless chain 13, while the other end extending from the lower surface of the platform 9c is provided with a roll 5 which has a collared portion 5a formed on the lower side thereof when viewed in FIG. 3 for supporting thereon the circuit board a. A tapered plate 15 of substantially circular shape and freely rotatably mounted on the shaft 14a is normally held in contact with the roll 5 by the urging force of a spring means such as coil spring 16 mounted on the shaft 14a in such a manner that the lower surface of the tapered plate 15 closely contacts the upper surface of the roll 5 without leaving any clearance therebetween. The rolls 5 with the grooves defined between the portion 5a and the plate 15 constitute guide means for the edge of a circuit board.

It is to be noted that the sprocket 17, driven by the endless chain 13, drives the roll 5 and the tapered plate 15 through the shaft 14a. In order to facilitate the rotation of the driving unit 14 with respect to the platform 9c, a suitable bearing or the like 14b and 14c may be provided.

According to this embodiment of the present invention, the number of engaging teeth provided on the sprocket 11a is equal to the number of teeth on each of the sprockets 17, so that the rate of rotation of the motor 12 corresponds to that of each of the sprockets 17.

It is to be noted that a suitable plate member 19, as shown in FIG. 1, may be provided on the platform 9c along and closely adjacent the endless chain 13 where it is engaged with the sprockets 17 for preventing the disengagement of the endless chain 13 from the sprockets 17.

An intake guiding member 21 having a substantially "L" shaped cross sectional configuration, is provided on the lower surface of the platform 9c for extending the supporting edge of the platform 9c towards the right when viewed in FIG. 1.

The intake guiding member 21 has a projecting edge 21a for supporting the edge of a circuit board thereon. In order to ensure the positioning of the guiding member 21, the platform 9c, as best shown in FIG. 6, has an engaging recess 20 into which the guiding member 21 fit and the guiding member 21 is tightly secured therein by suitable securing screws 22.

An outlet guiding member 24 is also provided on the lower surface of the platform 9c to extend the supporting edge of the platform 9c towards the left when viewed in FIG. 1. The outlet guiding member 24 has a plurality of rotatably journalled rolls 26 each including, as best shown in FIG. 5, a shaft 26a extending in a direction parallel to the supporting bar 7a, a rotatable ring member 26c mounted on the shaft 26a through a suitable bearing 26b and a flange member 26d fixedly mounted on the ring member 26c for supporting the edge of the circuit board a on the ring member 26c and guiding the edge by means of the flange member 26d. The outlet guiding member 24 is engaged in an elongated groove 23 formed in the lower surface of the platform 9c and is secured therein by suitable securing screws 24a.

It is to be noted, according to this embodiment of the present invention, that the projecting edge 21a of the intake guiding member 21, the collared portions of the rolls 5 and the ring members 26c lie along a straight guiding edge in the first supporting unit 8 as indicated by the dotted line B in FIG. 2.

The second supporting unit 28 of substantially elongated shape for supporting and guiding the other edge of the circuit board a comprises first and second clamping members 29a and 29b and a platform 29c which are arranged in a manner similar to that described above in connection with the first supporting unit 8.

The second supporting unit 28 further comprises a plurality of guiding units 25 which are aligned along the upper edge, when viewed in FIG. 1, of the platform 29c separated at a pitch λ from each other, so as to correspond with the driving units 14 provided on the first supporting unit 8. Each of the guiding units 25, as best shown in FIG. 4, comprises a shaft 27 rotatably journalled in the platform 29c with one end extending from the upper surface of the platform 29c provided with a retaining ring 27a for holding the shaft 27 in the platform 29c and the other end extending from the lower surface of the platform 29c has fixed thereon a grooved roll 30. A suitable bearings may be provided between the shaft and the platform 29c for facilitating the rotation of each guiding unit 30. The groove in the roll 30 is defined by three walls, the first wall 30a provided at the upper side of the roll being slanted with respect to the axis of the roll, the second wall 30b provided at approximately center of the roll being parallel to the axis, and the third wall 30c provided at the lower side of the roll being perpendicular to the axis. The rolls 30 constitute guide means for the edge of a circuit board in the same manner as the rolls 5.

The second supporting unit 28 also has, at opposite ends of the platform 29c, an intake guiding member 31 having projecting edge 31a, and an outlet guiding member 24 having a plurality of flanged rolls 36 each constituted by a rotatable ring member 36c and a flange member 36d, similar to the guiding members described above in connection with the first supporting unit 8. It is to be noted that the projecting edge 31a of the intake guiding member 31, the grooves in the rolls 30 and the ring member 36c lie along a straight guiding edge in the second supporting unit 28.

It is to be noted that an imaginary plane extending between the straight guiding edge in the first supporting unit 8 and the guiding edge in the second supporting unit 28 define the passage for the circuit board a.

The blade member 3 described above is spaced from the imaginary plane and is in parallel relation thereto for trimming the excess length of wires extending from the circuit board. The diameter of the blade 3 is larger than the distance between the opposite straight guiding edges.

It is also to be noted that the intake guiding member 21 provided in the first supporting unit 8 is longer than that provided in the second supporting unit 28 for facilitating the placing of the circuit board a between the guiding members 21 and 31. The trimming apparatus described above operates in the manner described hereinbelow.

For manual placing of the circuit board a between the members 21 and 31, first one edge of the board a is placed on the projecting edge 21a of the member 21, and then the other edge of the board a is placed on the projecting edge 31a of the member 31. Then the board is pushed in the direction indicated by the arrow W between the first and second supporting units 8 and 28. FIG. 7 shows the circuit board a in chain lines positioned between the guiding members 21 and 31. When the leading edge of the board a contacts the driving unit 14 positioned on the right-hand side of the first supporting unit 8, the board is tightly clamped between the driving unit 14 and the guiding unit 30 which is positioned opposite to the driving unit 14, and the rotation of the driving unit 14 transmits the board in the direction of the arrow W. When the board moves past the rotating blade member 3, the excess length of lead wires extending downwardly from the board is trimmed so that the lead wires are all a predetermined length determined by the level at which the blade member 3 is positioned. Thereafter, the board is further transported to a position between the outlet guiding members 24 and 34, more specifically between the flange members 26d and 36d. Since neither one of the rolls 26 or 36 is driven, the board is merely positioned therebetween. When a subsequent board arrives between the guiding members 24 and 36, the first mentioned board is pushed further in the direction W. Since the guiding member 24 is shorter than the guiding member 36, first the one edge of the board supported by the second supporting unit falls away therefrom and then the board itself falls down towards a chute positioned at the left-hand side of the trimming apparatus. The plate 37 constituting the chute is detachably connected to the base plate 1 by suitable securing screws and is preferably slanted to slidingly guide the circuit board in a direction indicated by the arrow Z. Such plate 37 is detachably mounted so that the direction of the chute can be changed such as to a direction opposite to the arrow Z or a direction corresponding with the arrow W.

While the circuit board moves past the driving units 14, as shown in FIG. 8, the edge 47a of the circuit board a is clamped between the roll 5 and the tapered plate 15, or more particularly, between the collar 5a on the roll 5 and the tapered face 15a of the tapered plate 15. On the other hand, the opposite edge 47b of the circuit board a is held in the groove of the roll 30 of the guiding unit 25, particularly between the first and third walls 30a and 30c thereof. When the thickness of successive circuit boards is different, for example, increases, the groove of the roll 30 holds the edge 47b at a position further radially outwardly of the axis thereof, that is adjacent the peripheral edge of the roll, and the other edge 47a is urged further into the groove formed between the flange 5a and the tapered face 15a by pushing the tapered plate 15 up against the biasing force of the spring 16. Therefore, such a thicker circuit board can be easily held between the first and second supporting units without exerting any force such as pressure between the opposite edges 47a and of the board, so that the shape of the board will not be deformed nor will it be scratched or cracked.

The width of the passage for the circuit board a can be easily changed by decreasing or increasing the distance between the first and second supporting units.

Although the length of the intake guiding members 21 and 31 are described as being different from each other, it is possible to replace the members 21 and 31 by members having the same length, especially when the trimming apparatus of the present invention is employed in an automatic assembly line in which the intake guiding member may be connected to a previous assembling apparatus such as a soldering apparatus or an apparatus for putting electronic and/or electric elements in prearranged holes in the circuit board. Likewise, the outlet members 24 and 34 can be replaced by members having the same length for further connection to an assembling apparatus such as soldering apparatus.

In the case where it is necessary to change the blade member 3 during the trimming operation of a number of circuit boards having the same width, it is necessary to slidably move the first and/or second supporting units along the supporting bars 7a and 7b. For this purpose, there are provided memory rings 38a, 38b, 38c and 38d for indicating the positions of the first and second supporting units. The memory rings 38a and 38d are mounted on the supporting bar 7a, and the memory rings 38b and 38c are mounted on the supporting bar 7b. For indicating the position of the first supporting unit 8, the memory rings 38d and 38c are moved along the supporting bars 7a and 7b to contact the first supporting unit 8, at which position, the memory rings 38d and 38c are tightly clamped on the respective supporting bars by a suitable clamping means 39. The position of the second supporting unit 28 is indicated by the memory rings 38a and 38b in the same manner described above. Thereafter, the first and second supporting units 8 and 28 can be loosened from the supporting bars 7a and 7b to further separate the supporting units. Then, securing screws 40 tightly holding the blade member 3 are removed to permit exchange of the blade member 3. After the blade member 3 has been changed, the first and second supporting units are returned to the original positions by merely sliding the first and second supporting units along the supporting bars until they come into contact with respective memory rings, and they are again fastened in position.

It is to be noted that the blade member 3, described as having a diameter larger than the distance between the supporting units, can have a diameter which is smaller than the distance therebetween, for the cases where it is necessary to trim the excess length of lead wires extending from only one particular zone of the circuit board.

It is also to be noted that the rolls 30 described as freely rotable on the platform 29c, may be provided with driving means for driving the rolls in a manner similar to that described for rotating the driving units 14.

The embodiment of the circuit board wire trimming apparatus of the present invention described above, has such features and advantages as are listed hereinbelow;

(i) Since the first supporting unit 8 holds the edge of the circuit board such that the edge is yieldingly held between the roll 5 and the tapered plate 15 with respect to shifts in position in the widthwise direction, the board is not subject to any excess load which may result in deformation of the circuit board, thus making it possible to trim the lead wires to a uniform length.

(ii) Since the tapered plate 15 biased towards the roll 5 can move up and down with respect to the roll 5, it is possible to clamp and transmit circuit boards having different thicknesses.

(iii) Since the tapered plate 15 can move up and down with respect to the roll 5, the circuit board clamped between the first and second supporting units can be held by an approximately uniform clamping force, regardless of any variation in the thickness of the boards.

(iv) Since the first and second supporting units are slidingly supported on the supporting bars 7a and 7b, it is possible to change the distance between the first and second supporting units for accommodating various sizes of circuit boards therebetween.

(v) It is possible to return the first and/or second supporting units to their original positions after they have been moved, due to the provision of the memory rings.

(vi) Since the intake guiding members 21 and 31 and also the outlet guiding member 24 and 34 are replaceable, it is simple to connect the trimming apparatus of the present invention with other assembling apparatus which supplies circuit boards which must be trimmed or which receives circuit boards which have been trimmed.

(vii) Since the guiding units 14 in the first supporting unit 8 are rotated continuously, it is possible to continue the trimming operation without any hindrance.

(viii) Since the plate constituting the chute 37 is detachably connected to the base plate 1, it is possible to change the direction of delivery of the trimmed circuit board.

(ix) Since intake guiding members 21 and 31, the outlet guiding members 24 and 34 and also the plate 37 are detachably mounted on the trimming apparatus, it is possible to remove them from the apparatus and to make the apparatus small in size for easy carrying, transporting and packing.

(x) Since the intake guiding members 21 and 31 have different lengths, it is easy to place the circuit board on the guiding members.

(xi) Since the rolls 30 of the second supporting unit 28 each have a slanted wall defining the groove thereof, it is possible to receive circuit boards having various thickness therein without causing any difference in the trimming operation.

Figure 9:
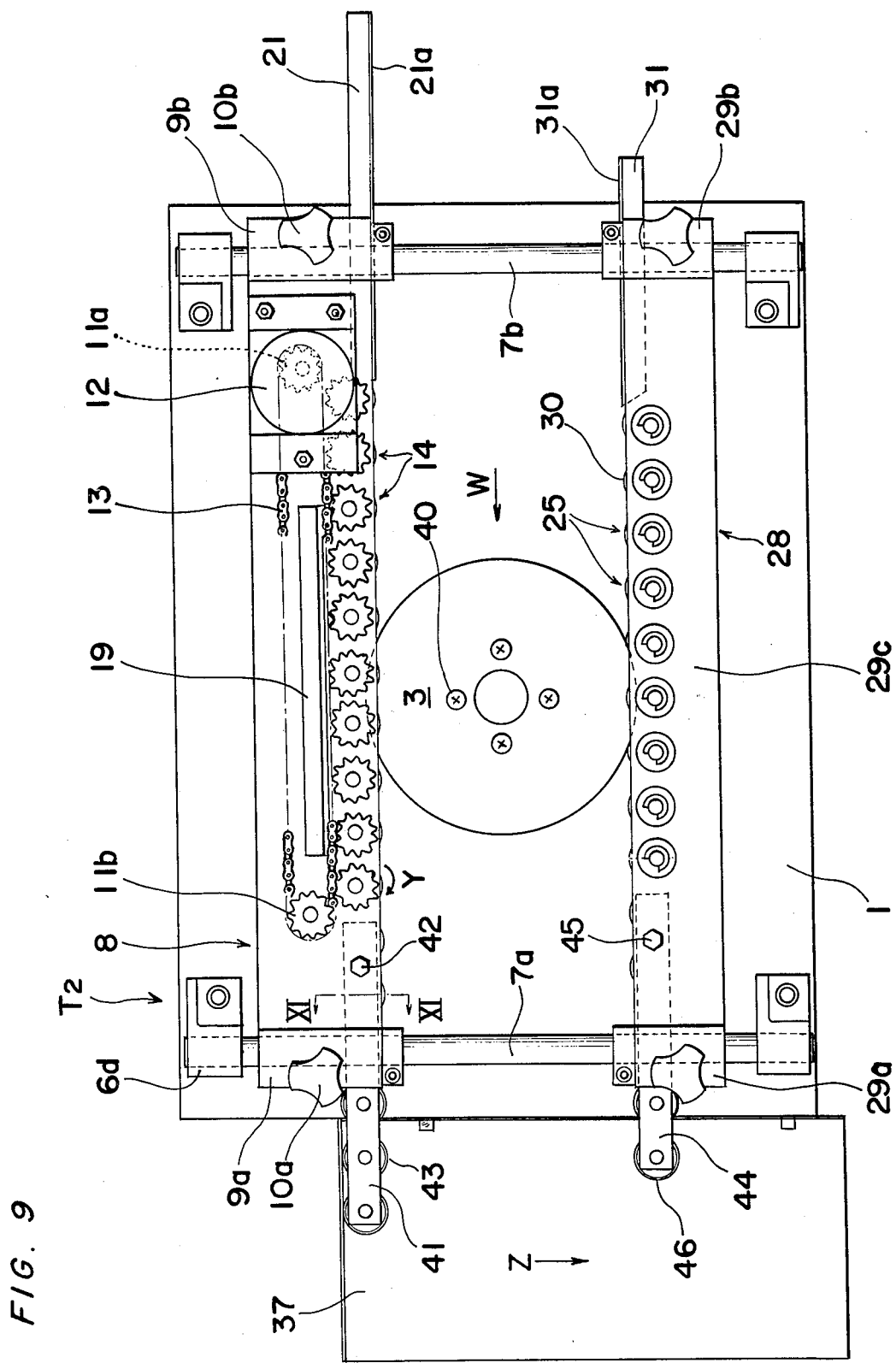
FIGS. 9 and 10 are views similar to FIGS. 1 and 2, respectively, but particularly showing a modification thereof.
Figure 10:
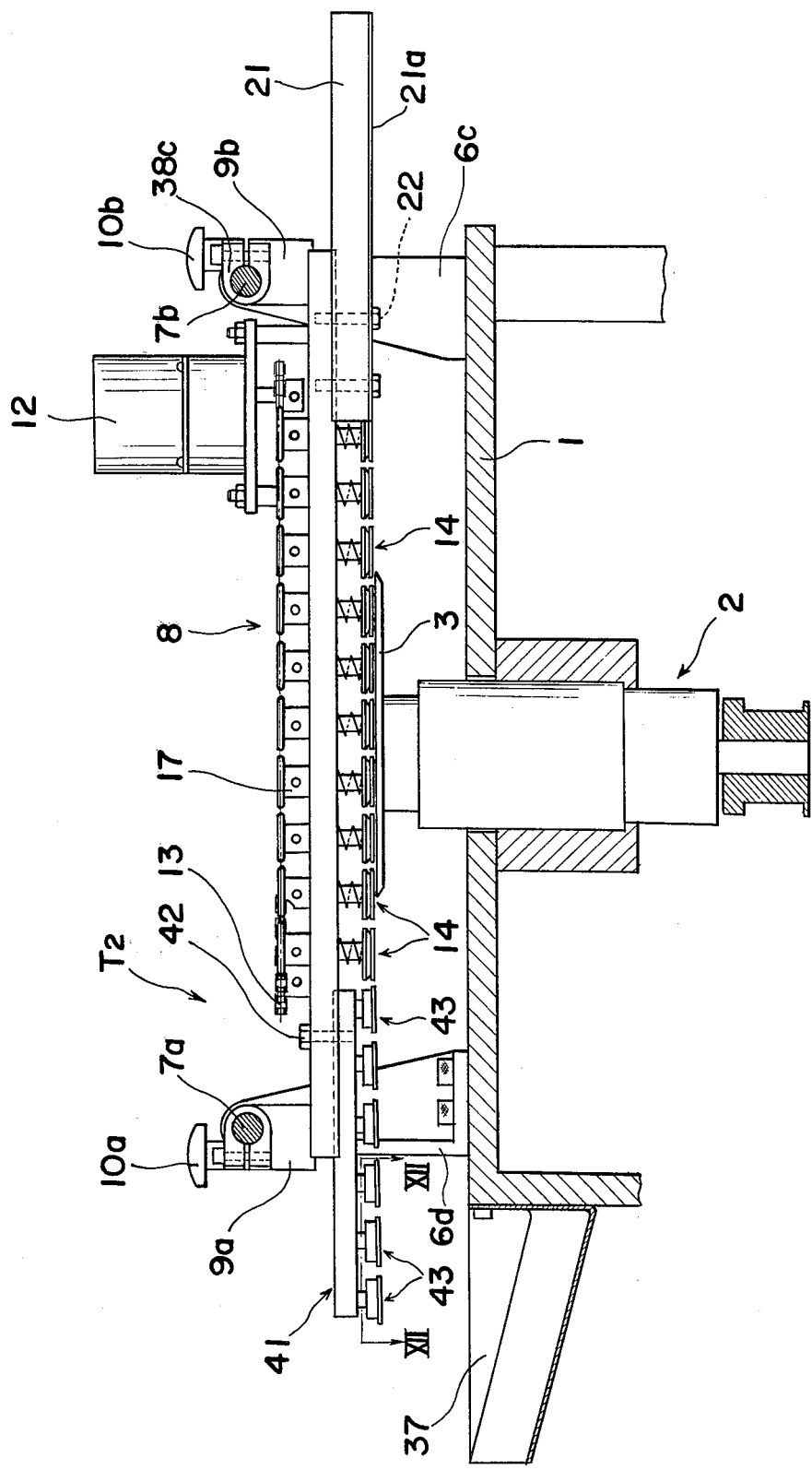

Referring to FIG. 9, there is shown a circuit board wire trimming apparatus $T_2$ which is a modification of the trimming apparatus $T_1$ described above.

The apparatus $T_2$ in this modification has a different arrangement of the outlet guiding members. The outlet guiding members, indicated by the reference numerals 41 and 44, are detachably mounted on the first and second supporting units 8 and 28, respectively, by securing screws 42 and 45 in the same manner as described above.

Figure 11:
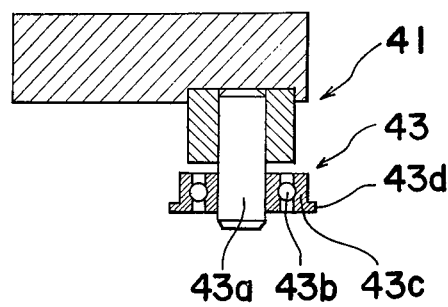
FIG. 11 is a cross sectional view taken along the line XI—XI in FIG. 9.
Figure 12:
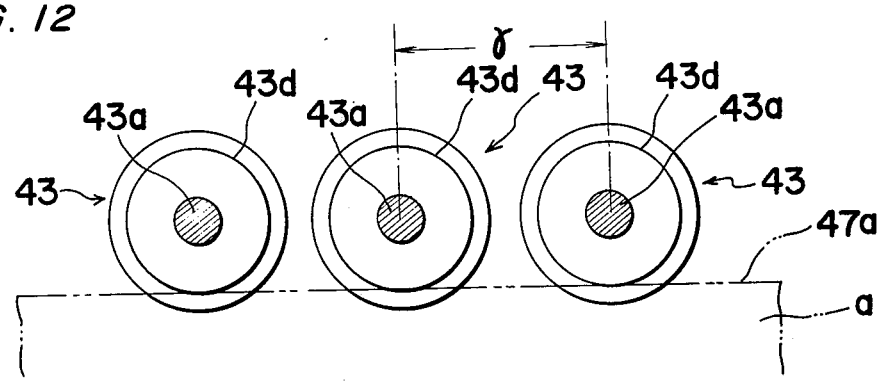
FIG. 12 is a cross sectional view taken along the line XII—XII in FIG. 10.

The outlet guiding member 41 has a plurality, for example six, rotatably journalled rolls 43 spaced from each other at a predetermined pitch $\gamma$, and each of the rolls 43 includes, as best shown in FIG. 11, a shaft 43a extending in a direction perpendicular to the supporting bar 7a, a rotatable ring member 43c mounted on the shaft 43a through a suitable bearing 43b, said ring member 43c having integrally formed therewith a flange portion 43d.

The first journalled roll 43 positioned adjacent the driving unit 14 has the upper surface of the flange portion 43d exactly in the plane of the upper surface of the roll 5 provided in the driving unit 14, so that the circuit board transmitted to said first journalled roll 43 is maintained in parallel relation to the horizontal plane.

Figure 13:
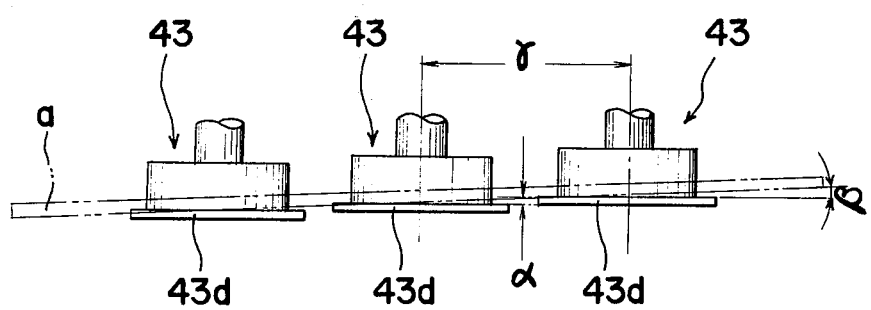
FIG. 13 is a fragmentary side view showing the arrangement of rolls journalled in an outlet guide bar.

The second journalled roll 43 positioned next to the first roll 43 is spaced below the first roll a distance $\alpha$, as shown in FIG. 13, and likewise, the third roll 43 is positioned below the second roll a distance $\alpha$. In other words, the flanges of the respective rolls at successively lower positions sequentially in the direction parallel to the direction of the movement of the circuit board with one of the flanges of the respective rolls spaced the predetermined distance $\alpha$ below the flange on the next adjacent roll.

It is to be noted that the outlet guiding member 44 also has the same journalled rolls 46 which are arranged in the same manner described above. Since, according to one arrangement, the outlet guiding member 44 is shorter than the other outlet guiding member 41, the number of the rolls 46 provided thereon is smaller than six such as five.

It is also to be noted that the first five journalled rolls 43 provided on the outlet guiding member 41 are opposed to the five rolls 46 provided on the outlet guiding member 44.

According to thus arranged outlet guiding members 41 and 44, the circuit board, after having moved past the second journalled roll of the succession of such rolls, starts to slant downwardly at an angle $\beta$ in relation to the horizontal plane. Therefore, the circuit board moving past the second journalled rolls is supported at points on the flange portions 43d rather than on the faces thereof, thus reducing the frictional resistance between the board and the journalled rolls and facilitating the forwarding of the board together with the rotation of the roll.

If the circuit board is curved downwardly with respect to the forwarding direction thereof, the leading edge of the board may not be hindered by the rolls, since the roll, more particularly flange portion 43d, positioned in front of the leading edge of the circuit board is positioned below the leading edge of the circuit board.

Figure 14:
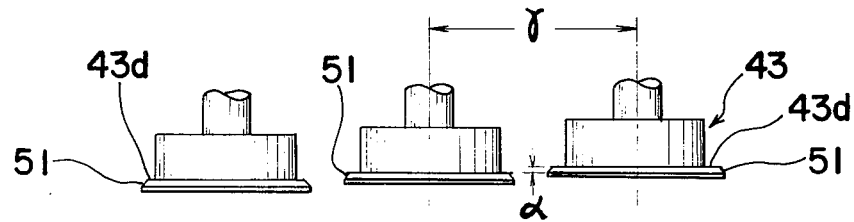
FIG. 14 is a view similar to FIG. 13, but particularly showing a modification thereof.

The effect of capturing the leading edge of the circuit board can be also obtained by forming a slanted face 51 around the peripheral edge of the flange portion 43d, as shown in FIG. 14. It is to be noted that the flange of the first roll described as positioned at the same level as the roll 5, may be positioned below the roll 5 the predetermined distance of $\alpha$.

In order to receive a circuit board which is further curved, the rolls may be arranged in successively lower relation to each other, and at the same time, the peripheral edge of the flange portion 43d may be provided with the slanged face 51 as described above.

The modified embodiment of the circuit board wire trimming apparatus of the present invention as described above, has the features and advantages listed hereinbelow;

(i) Since the point contact between the circuit board and the flange portion 51 of the roll reduces the frictional resistance therebetween, a circuit board having a rough surface or coated with flux can be forwarded easily and smoothly.

(ii) Since the rolls 43 as well as the rolls 46 are arranged successively lower, a circuit board which is curved downwardly with respect to the forwarding direction thereof can be forwarded smoothly.

(iii) By providing the rolls 43 as well as the rolls 46 with a slanted face 51, it is possible to forward a curved circuit board smoothly.

(iv) By arranging the rolls 43 as well as the rolls 46 successively lower, while at the same time providing the rolls with the slanted face 51, it is possible to forward a curved circuit board.

In the case where the circuit board a which is curved downwardly in the direction of its movement W is clamped between the driving unit 14 and the guiding unit 25 while being forwarded in the direction W, the leading edge of the circuit board may be positioned slightly below the intermediate portion of the board when the board is supported by the driving unit 14 and the guiding unit 25. In order that the leading edge of the board engages the next pair of units 14 and 25, it is necessary to lower the surface on which the leading edge is to be supported.

Furthermore, in the case where the circuit board a is made of a material that the rolls 5 and 30 are apt to damage, such as scratching or cracking the edge of the circuit board which is engaged, it is necessary to reduce the area or zone of contact between the rolls and the board.

For these two reasons, improved types of driving units 14 and guiding units 25 are described hereinbelow.

Referring to FIGS. 15-20, there are shown a driving unit 14 and a guiding unit 25 which are modifications of those described above in connection with the previous embodiments.

Figure 15:
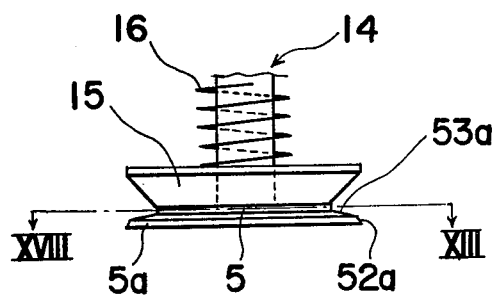
FIg. 15 is a fragmentary side view showing details of a roll provided in a driving unit.

Referring particularly to FIG. 15, the driving unit 14 in this modification has two different slanted surfaces formed on the collar portion 5a of the roll 5. A first slanted surface 52a formed on the upper surface of the collar portion at the outer peripheral portion thereof is slanted at an angle $\theta_1$ (FIG. 18) with respect to the axis of the roll 5, while a second slanted surface 53a formed on the upper surface of the collar portion 5a on the remaining inner peripheral portion thereof is slanted at an angle $\theta_2$ (FIG. 18) with respect to the axis of the roll 5. It is to be noted that the angle $\theta_2$ is greater than the angle $\theta_1$.

Figure 16:
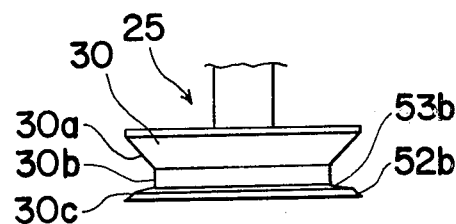
FIG. 16 is a fragmentary side view showing details of a roll provided in a guiding unit.

In a similar manner, the lower surface i.e., the surface 30c of the roll 30 provided in the guiding unit 25 has first and second slanted surfaces 52b and 53b, as shown in FIG. 16.

Figure 17:
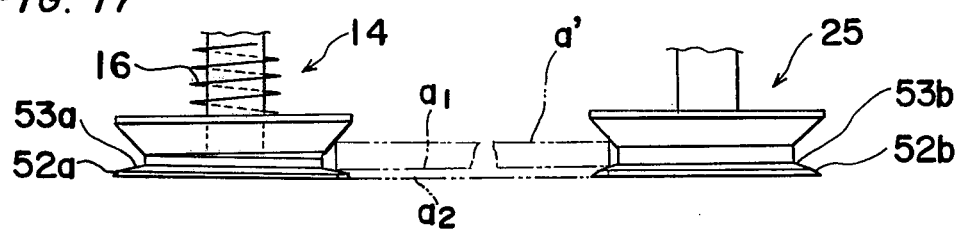
FIG. 17 is a schematic side view showing the relation between pair of rolls provided in the units and the circuit board.
Figures 18, 19:
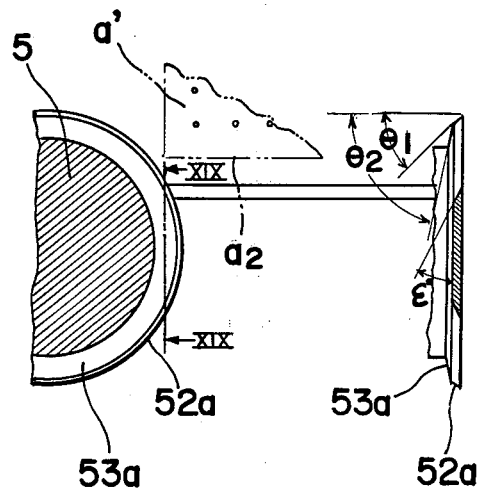
FIG. 18 is a cross sectional view substantially taken along the line XVIII—XVIII in FIG. 15.
FIG. 19 is a cross sectional view taken along the line XIX—XIX in FIG. 18.

When the circuit board a', is curved downwardly in the direction of movement thereof, as shown in FIG. 17, the intermediate portion thereof indicated by phantom line $a_1$ extends between the second slanted surfaces 53a and 53b of the rolls 5 and 30, respectively, while the leading edge of the board a' indicated by phantom line $a_2$ is positioned lower than the line $a_1$.

When the board a' is forwarded and the leading edge thereof is about to contact the rolls 5 and 30 of the next units 14 and 25, the leading edge first contacts the first slanted surfaces 52a and 52b of the respective rolls, and then the edge is caused to slide along the first slanted surfaces and further onto the second slanted surfaces 53a and 53b so that the leading edge is lifted.

Although the angle of the first slanged surfaces is described as $\theta_1$ which may be 45° in one specific embodiment, the angle of the slope through which the leading edge of the board a' actually climbs is smaller than $\theta_1$. When the board a' moves past the roll such as roll 5, the locus of the side edge of the board a' extend diagonally across the collar portion thereof. Such locus corresponds to the section line XIX—XIX shown in FIG. 18. As is apparent from FIG. 19, the leading edge of the board a' climbs up the first slanted surface substantially at an angle $\epsilon$ which may be about 28° in the above described embodiment. Therefore, the leading edge of the circuit board a' can be easily guided onto the second slanted surface 53a.

The circuit board thus guided onto the second slanted surfaces 53a and 53b is supported thereon at points rather than on a line or an area, so that the side edges of the board which contact the rolls 5 or 30 will not be scratched nor cracked.

Furthermore, with such an arrangement of the rolls is described above, the section of the circuit board a' which is positioned between one pair of units and the next pair of units is straightened so that the board a' is approximately straight, so that the wires can be trimmed evenly, whereby, the lengths of the wires projecting from the board are the same.

Figure 20:
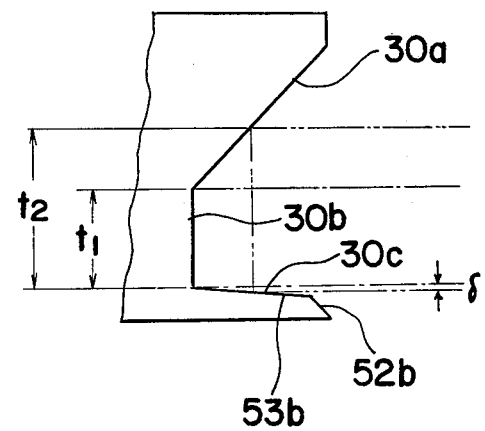
FIG. 20 is a fragmentary side view on an enlarged scale showing a detail of the peripheral portion of the roll provided in the guiding unit.

If the circuit board a has a variation in the thickness, the edge is urged further into the groove formed in the roll 30 as the thickness becomes less. For example, when the thickness is equal to $t_1$ which is equal to the thickness of second wall 30b of the groove, as shown in FIG. 20, or smaller, the edge of the board will be in contact with the second wall 30b. When the thickness is greater than $t_1$, such as $t_2$, the edge contacts the second slanted surface 53b. Since the second slanted surface is approximately in a horizontal plane, the difference in the level of the lower surface of the board, indicated by $\delta$ in FIG. 20, is comparatively small. Therefore, such difference $\delta$ hardly affects the length of the trimmed wires.

Figure 21:
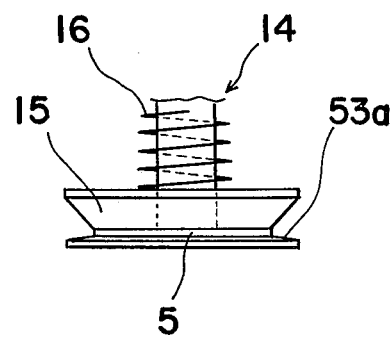
FIG. 21 is a view similar to FIG. 15, but particularly showing a modification thereof.

For a circuit board which is comparatively flat but easily damaged, it is only necessary to provide the second slanted surfaces 53a and 54b in the rolls 5 and 30, respectively, as shown in FIG. 21 as one example therefor.

Figure 22:
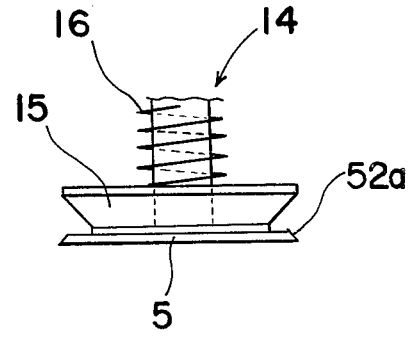
FIG. 22 is a view similar to FIG. 15, but particularly showing further modification thereof.

On the contrary, for a circuit board which is curved but made of comparatively rigid material, it is only necessary to form the first slanted surfaces 52a and 52b in the rolls 5 and 30, respectively, as shown in FIG. 22 as one example thereof.

The modification of the circuit board wire trimming apparatus of the present invention described above has the features and advantages listed hereinbelow;

(i) The first slanted surface formed on the respective rolls 5 and 30 prevents the circuit board from being injured for example, scratched or cracked.

(ii) The second slanted surface formed on the respective rolls 5 and 30 captures and lifts the leading edge of the circuit board which is curved downwardly with respect to the direction of movement of the board.

(iii) The second slanted surface hardly changes the height or level of the circuit board.

Figure 23:
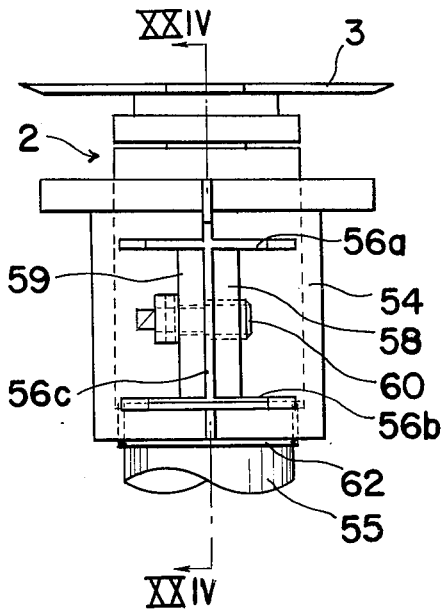
FIG. 23 is a side elevational view of a spindle member incorporated in said apparatus.
Figure 24:
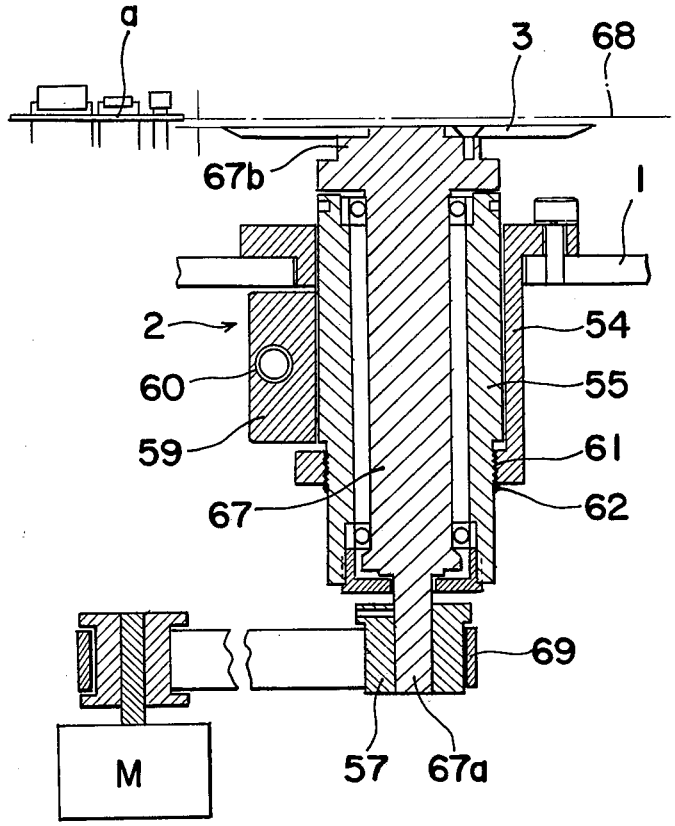
FIG. 24 is a cross sectional view substantially taken along line XXIV—XXIV in FIG. 23.

Referring to FIGS. 23 and 24, there is shown a detail of one embodiment of the spindle unit 2 which comprises an outer casing 54 having a substantially cylindrical shape having at one end a flange for securing the outer casing 54 on the base plate 1 and at the other end a reduced diameter portion with the inner surface 61 thereof threaded. An inner casing 55 having a substantially cylindrical shape has an outer diameter smaller than the inner diameter of the outer casing, and is longer than the outer casing 54. The inner casing 55 has, at an intermediate portion, a threaded surface 62 which engages with the threaded surface 61 in the outer casing 54 when the inner casing 55 is inserted into the outer casing 54.

In order to tightly fasten the inner casing 55 onto the outer casing 54, grooves 56a, 56b and 56c are provided in the outer casing 54, as shown in FIG. 23, each of the grooves 56a and 56b extending around the periphery of the cylinder casing 54 a predetermined distance, and in parallel relation to and spaced a predetermined distance from each other, and the groove 56c extends between the grooves 56a and 56b approximately between the centers thereof. Flanges 58 and 59 are provided at opposite edges of the groove 56c and are linked by a bolt and nut 60 for drawing the flanges 58 and 59 towards each other, and thus reducing the inner diameter of the outer casing 54 to tightly clamp the inner casing 55 therewithin.

A spindle member 67 is inserted into the inner casing 55 and is rotatably supported at opposite ends of the inner casing in suitable bearings. One end portion 67a of the spindle member 67 extends outwardly from the inner casing 55 and has tightly mounted thereon a pulley 57. An endless belt 69 extends around the pulley 57 and also around a driving means such as motor M for rotating the spindle member 67. The other end portion 67b of the spindle member 67 extends outwardly from the inner casing 55 and has mounted thereon the blade member 3 which is positioned so as to rotate in a plane parallel to and adjacent the plane 68 of movement of the circuit board.

In order to change the distance between the blade member 3 and the plane 68 for changing the length of trimmed lead wires, the bolt and nut 60 are loosened and the inner casing 55 is turned with respect to the outer casing 54 along the threaded surfaces, and thus, the inner casing together with the spindle member 67 and the blade member 3 is moved up or down to a required position.

With the spindle unit 2 employed in the trimming apparatus of the present invention, it is possible to precisely adjust the level of the blade member 3 by the rotation of the inner casing 55 with respect to the outer casing 54.

For convenience in setting the blade member 3 at a required level, a suitable scale may be provided on the inner casing 55 along the outer peripheral surface thereof for indicating the height or level of the blade member 3 in relation to the degree of rotation of the inner casing 55.

Figure 25:
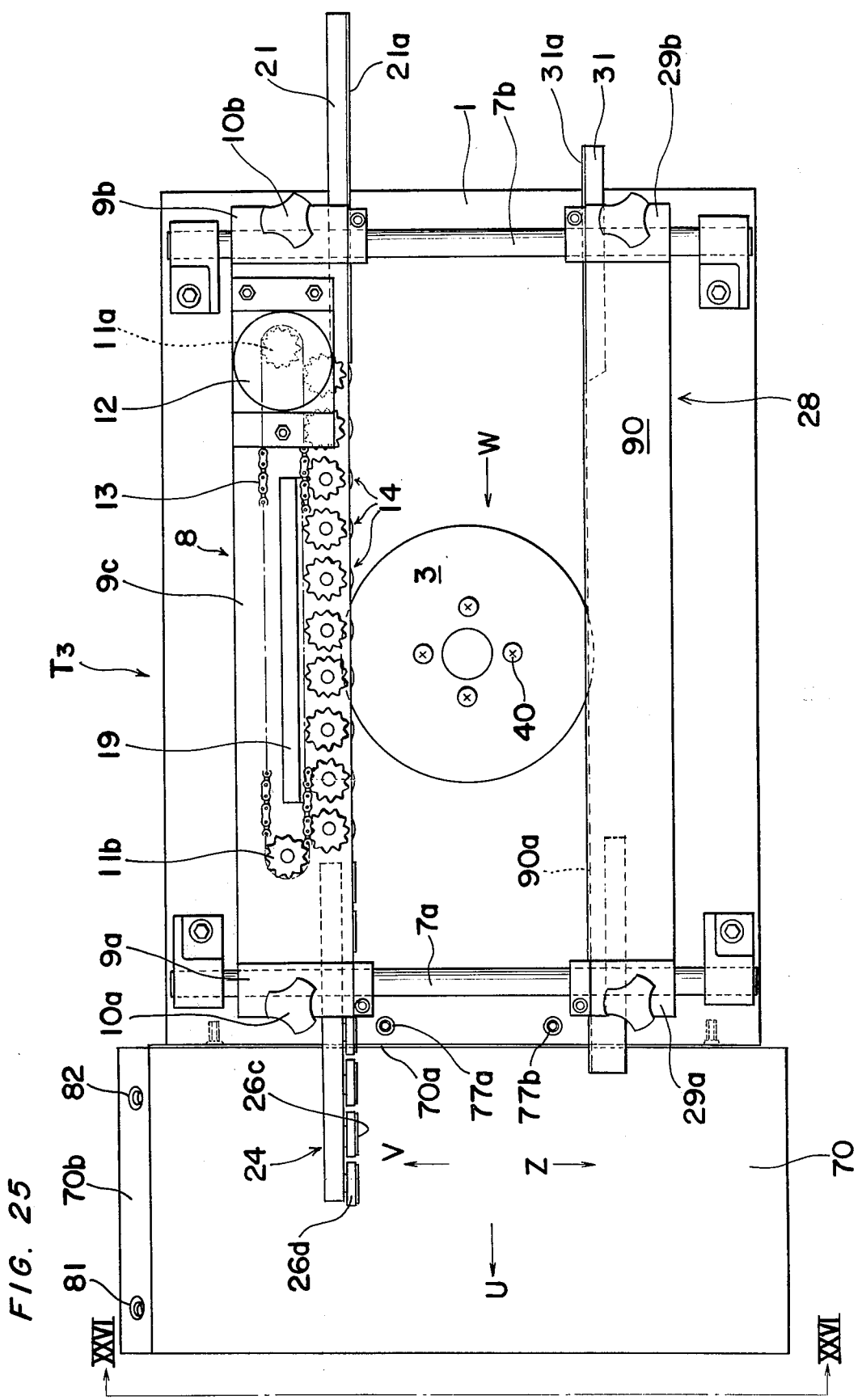
FIG. 25 is a similar view to FIG. 1, but particularly showing further modification thereof.

Referring to FIG. 25, there is shown a circuit board wire trimming apparatus T₃ which is a modification of apparatus T₁ shown in FIG. 1. In this modification, the second supporting unit 28 comprises a platform 90 which is supported by the first and second clamping members 29a and 29b in the same manner as described above. The platform 90 has an elongated guiding groove 90a along the upper edge, when viewed in FIG. 25, which replaces the plurality of grooved rolls 30. It is to be noted that the cross sectional configuration of the groove 90a is same as that of the groove in the rolls 30.

Figure 26:
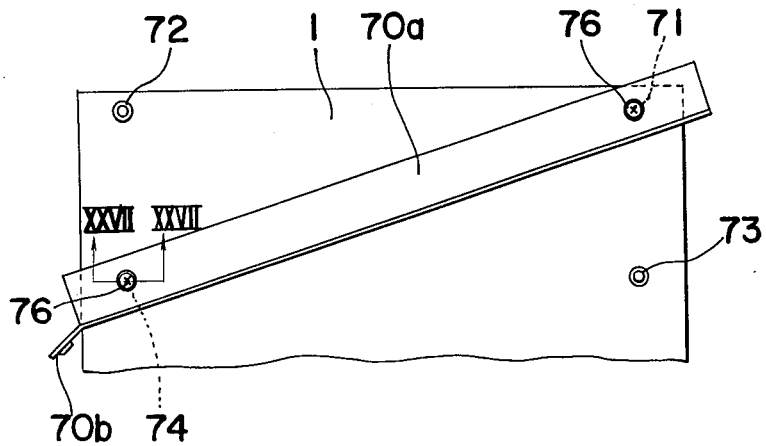
FIG. 26 is a side elevational view of the circuit board trimming apparatus shown in FIG. 25.
Figure 27:
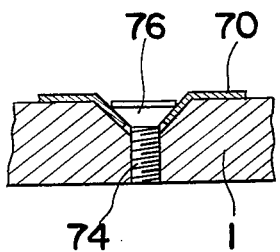
FIG. 27 is a cross sectional view taken along the lines XXVII—XXVII shown in FIG. 26.

A plate 70 having a substantially rectangular shape constituting the chute has, as shown in FIG. 26, a first rim portion 70a extending along one elongated edge in perpendicular relation thereto and a second rim portion 70b extended along another edge, which is perpendicular to said one elongated edge, and at an obtuse angle with respect to the plate 70.

The first rim portion 70a has at least two countersunk openings at opposite end portions thereof for receiving a tapered-head screw 76. The side surface of the base plate 1 which contacts the plate 70 has at least four counter-sunk threaded openings 71, 72, 73 and 74. In order to direct the inclination of the chute in one direction perpendicular to the movement of the circuit board along the supporting units, such as the direction V indicated in FIG. 25, the plate 70 is held on the base plate 1 such that counter-sunk openings in the first rim portion 70a are in alignment with the counter-sunk threaded openings 71 and 74, respectively, as shown in FIG. 26. On the other hand, to direct the inclination of the chute in the other direction perpendicular to the movement of the circuit board along the supporting units, such as the direction Z indicated in FIG. 25, the counter-sunk openings are aligned with the counter-sunk threaded openings 72 and 73, respectively. When inserting a screw, needless to say the screw head should be below or flush with the plane of the rim portion 70a.

For discharging the circuit boards in a direction corresponding to the movement of the circuit board along the supporting units, such as the direction U indicated in FIG. 25, the second rim portion 70b can be connected to the edge of the base plate 1 by screws 71 in counter-sunk threaded openings 77a and 77b provided adjacent the supporting bar 7a.

With the structure of the chute as described above it is possible to change the direction of discharge of the trimmed circuit board to any of three directions.

Although the present invention has been fully described by way of example with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A circuit board wire trimming apparatus for trimming wire members protruding outwards from a circuit board, which comprises, in combination:
   a framework;
   first and second elongated support means for supporting the circuit board and for transporting the circuit board in one direction parallel to the lengthwise direction of said first and second elongated support means, said first elongated support means having a plurality of driving members carried thereby in a row in equally spaced relation to each other in a direction parallel to the direction of transportation of the circuit board, each of said driving members being constituted by a pair of coaxially aligned roll elements supported by said first elongated support means for rotation in a plane parallel to the plane of the circuit board being transported, said roll elements of each pair being placed one above the other and cooperating with each other to define a groove therebetween, said second elongated support means having a guide means defined therein lengthwise of said second elongated support means for movable engagement of one of the opposed side edges of said circuit board therewith;
   means for holding said first and second elongated supporting means over said framework;
   means for driving the driving members simultaneously to rotate the roll elements of all pairs;
   means provided for each of the roll elements for biasing either one of said roll elements of each pair towards the other of said roll elements of each pair to hold the other of the opposite side edges of the circuit board therebetween, thereby enabling the transmission of the rotational force of the roll elements of any pair to the circuit board to move the latter in said one direction with said opposed edges of the circuit boards respectively movably engaged in said guide means and said grooves defined between the pairs of the roll elements;

a blade member rotatably supported on the framework for rotation about an axis thereof in a plane parallel to the plane of the circuit board, said blade member being positioned to trim the excess length from the wire members while said circuit board is transported with the opposed side edges respectively guided by the first and second elongated support means; and means for driving said blade member.

2. A circuit board wire trimming apparatus as claimed in claim 1, wherein one roll element of said pair of roll elements has a collar portion around the peripheral edge thereof for receiving thereon and supporting said one of the opposite side edges of said circuit board, and the other roll element of said pair of roll elements positioned above the one roll element being having a slanted peripheral surface with respect to the plane of the circuit board being transported, whereby said one of the opposed side edges of said circuit board is held between said collar portion and said slanted surface.

3. A circuit board wire trimming apparatus as claimed in claim 2, wherein said collar portion has one surface facing said slanted peripheral surface being slanted, whereby said groove has a substantially V-shape cross sectional configuration.

4. A circuit board wire trimming apparatus as claimed in claim 3, wherein said one surface of said collar portion has an outer slanted zone and an inner slanted zone, the outer slanted zone being slanted with respect to the plane of the circuit board being transported at an angle greater than the angle of the inner slanted zone.

5. A circuit board wire trimming apparatus as claimed in claim 1, wherein said guide means comprises a first wall provided for receiving thereon and supporting said other of the opposite side edges of said circuit board and a second wall provided above said first wall, said second wall being slanted with respect to said plane of the circuit board being transported and defining with said first wall a groove for holding said other of the opposite side edges of said circuit board between said first and second walls.

6. A circuit board wire trimming apparatus as claimed in claim 5, wherein said first wall is slanted, whereby said guide groove has a substantially V-shape cross sectional configuration.

7. A circuit board wire trimming apparatus as claimed in claim 6, wherein said first wall has an outer slanted wall zone and an inner slanted wall zone, the outer slanted wall zone being slanted with respect to said plane of the circuit board being transported at an angle greater than the angle of the inner slanted wall zone.

8. A circuit board wire trimming apparatus as claimed in claim 1, wherein said guide means comprises means defining an elongated groove along a side edge of the second elongated support means.

9. A circuit board wire trimming apparatus as claimed in claim 1, wherein said guide means comprises a plurality of peripherally grooved rotatable roll members in a row in said second elongated support means in equally spaced relation to each other in a direction parallel to the direction of transportation of the circuit board.

10. A circuit board wire trimming apparatus as claimed in claim 1, wherein said holding means comprises a plurality of supporting bars extending perpendicular to the direction of transportation of the circuit board, each of said first and second elongated support means being slidably connected to said supporting bars for enabling changing the distance between the first and second elongated support means.

11. A circuit board wire trimming apparatus as claimed in claim 10, further comprising means for indicating positions of at least one of said first and second elongated support means said memorizing means being mounted for movement along at least one of said supporting bars for setting said memorizing means at any place along the supporting bar for the engagement between the memorizing means and said one of said first and second elongated support means.

12. A circuit board wire trimming apparatus as claimed in claim 11, wherein said indicating means is a ring member slidingly mounted on said one of said supporting bars.

13. A circuit board wire trimming apparatus as claimed in claim 1 further comprising first and second elongated outlet guide members provided on said first and second elongated support means, respectively, at one end thereof for defining an outlet guide for said circuit board after being transported between said groove and guide means.

14. A circuit board wire trimming apparatus as claimed in claim 13, wherein one of said first and second elongated outlet guide members is longer than the other elongated outlet guide member.

15. A circuit board wire trimming apparatus as claimed in claim 13, wherein each of said first and second elongated outlet guide members comprises a bar member and a plurality of roll members carried by said bar member in equally spaced relation to each other in the direction parallel to the direction of transportation of the circuit board, each of said roll members having a flange portion therearound and being rotatably supported by said bar member for rotation in a plane parallel to the plane of the circuit board being transported, thereby supporting said opposite edges of said circuit board on said flange portion.

16. A circuit board wire trimming apparatus as claimed in claim 15, wherein said plurality of roll members are positioned such that the flanges of the respective rolls are sequentially lower in the direction parallel to the direction of transport of said circuit board with one of the flanges of the respective rolls spaced a predetermined distance downwards from the next adjacent flange of the corresponding roll member.

17. A circuit board wire trimming apparatus as claimed in claim 15, wherein said flange portions are slanted with respect to the plane of the circuit board being transported.

18. A circuit board wire trimming apparatus as claimed in claim 13, wherein each of said first and second elongated outlet guide members comprises a bar member and a plurality of roll elements carried by said bar member in equally spaced relation to each other in the direction parallel to the direction of transportation of the circuit board, each of said roll members having a cylindrical face and a flange portion therearound and being rotatably supported by said bar member for rotation in a plane perpendicular to the plane of the circuit board being transported, thereby supporting said opposite edges of said circuit board on said cylindrical face and said circuit board being guided between flange portions of opposite roll members.

19. A circuit board wire trimming apparatus as claimed in claim 13 further comprising first and second elongated inlet guide members on said first and second elongated support means, respectively, at the other end thereof for defining an inlet guide for said circuit board prior to being positioned between said groove and guide means.

20. A circuit board wire trimming apparatus as claimed in claim 19, wherein one of said first and second elongated inlet guide members is longer than the other elongated inlet guide member.

21. A circuit board wire trimming apparatus as claimed in claim 1 further comprising a spindle member coupled to said blade member, an inner casing rotatably supporting said spindle member, an outer casing fixedly connected to said framework for movably supporting said inner casing for changing the distance between said blade member and the plane of the circuit board being transported by moving said inner casing with respect to said outer casing.

22. A circuit board wire trimming apparatus as claimed in claim 21, wherein said inner casing is threaded into said outer casing.

* * * * *